(12) United States Patent  
Horng

(10) Patent No.: US 7,091,121 B2  
(45) Date of Patent: Aug. 15, 2006

(54) BUMPING PROCESS

(75) Inventor: Ching-Fu Horng, Magung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 113 days.

(21) Appl. No.: 10/753,317

(22) Filed: Jan. 9, 2004

(65) Prior Publication Data

US 2004/0266163 A1   Dec. 30, 2004

(30) Foreign Application Priority Data

Jun. 30, 2003   (TW) .............................. 92117894 A

(51) Int. Cl.
*H01L 21/44* (2006.01)

(52) U.S. Cl. ...................... 438/612; 438/614; 438/656; 438/669

(58) Field of Classification Search ................ 438/612, 438/614, 656, 669, 652
See application file for complete search history.

(56) References Cited

U.S. PATENT DOCUMENTS

| 5,162,257 | A | 11/1992 | Yung |
| 5,462,638 | A | 10/1995 | Datta et al. |
| 5,508,229 | A | 4/1996 | Baker |
| 6,013,572 | A | 1/2000 | Hur et al. |
| 6,287,893 | B1 * | 9/2001 | Elenius et al. ............... 438/108 |
| 6,455,408 | B1 * | 9/2002 | Hwang et al. ............... 438/613 |
| 6,696,357 | B1 * | 2/2004 | Imai et al. ................... 438/612 |
| 6,780,748 | B1 * | 8/2004 | Yamaguchi et al. ........ 438/612 |

* cited by examiner

*Primary Examiner*—Zandra V. Smith  
*Assistant Examiner*—Christy Novacek  
(74) *Attorney, Agent, or Firm*—Bacon & Thomas, PLLC

(57) ABSTRACT

A bumping process mainly comprises the following steps. Initially, a wafer having a plurality of bonding pads and a passivation layer, which exposes the bonding pads, is provided. Next, a first dielectric layer is disposed on the wafer so as to form a plurality of first openings and second openings. The first openings and the second openings expose the bonding pads and the passivation layer respectively. Afterward, a patterned first electrically conductive layer is formed on the first dielectric layer, the bonding pads and the passivation layer exposed out of the first dielectric layer through the second openings. Then, a second patterned conductive layer is formed directly on the first patterned conductive layer. Next, a second dielectric layer is formed on the first dielectric layer and the patterned second electrically conductive layer, and exposes portions of the second patterned layer through the second openings so that the exposed portion of the second patterned layer through the second openings are regarded as a plurality of bump pads. Therein, the bump pads are electrically connected to the bonding pads through the patterned first electrically conductive layer and the patterned second electrically conductive layers. Finally, a plurality of bumps are formed on the bump pads and the bumps are then reflowed to be mounted securely on the bump pads.

20 Claims, 5 Drawing Sheets

BUMPING PROCESS

BACKGROUND OF THE INVENTION

1. Field of Invention

This invention relates to a bumping process. More particularly, the present invention is related to a method for patterning the first electrically conductive layer of the UBM layer (Under Bump Metallurgy layer) and then patterning the second electrically conductive layer on said patterned first electrically conductive layer.

2. Related Art

In this information explosion age, integrated circuit products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuit package. Moreover, compared with a wire-bonding package or a tape automated bonding (TAB) package, a flip-chip package uses a shorter electrical path on average and has a better overall electrical performance. In a flip-chip package, the bonding pads on a die and the contacts on a substrate are connected together through a plurality of bumps formed by the method of bumping process. Accordingly, the technology of bumping process becomes more and more important in the advanced packaging fields.

Referring to FIG. 1, it shows a flow chart illustrating the process flow of a conventional bumping process. The conventional bumping process mainly comprises the following steps. Firstly, a wafer having a plurality of bonding pads and a passivation layer is provided as shown in the step of S101. Therein, the passivation layer exposes the bonding pads. Next, a first dielectric layer is formed over the wafer and exposes the bonding pads through a plurality of first openings and the passivation layer through a plurality of second openings as shown in the step of S102.

Afterwards, a redistributed layer is formed over the first dielectric layer, the bonding pads and the passivation layer as shown in the step of S103. Generally speaking, the redistributed layer comprises a patterned first electrically conductive layer and a patterned second electrically conductive layer. Therein, the patterned first electrically conductive layer and the patterned second electrically conductive layer are formed by the steps of forming the first electrically conductive layer and the second electrically conductive layer above the passivation layer, forming a photo-resist layer above the second electrically conductive layer, patterning the photo-resist layer through photolithography and etching processes and then removing portions of the first electrically conductive layer and the second electrically conductive layer as shown in the step of S104.

Moreover, a second dielectric layer is formed on the patterned second electrically conductive layer and exposes portions of the patterned first electrically conductive layer and the patterned second electrically conductive layer through the second openings so that the exposed portions of the patterned second electrically conductive layer are regarded as bump pads as shown in the step of S105. Therein, the bump pads are electrically connected to the bonding pads through the redistributed layer (the patterned first electrically conductive layer and the patterned second electrically conductive layer).

Finally, there are bumps formed on the bump pads and the bumps are then reflowed to be fixed on the bump pads more securely and shaped into a ball-like shape (step of S106).

In the aforementioned conventional bumping process, the redistributed layer applicable to bumping process for the copper wafer mainly comprises a titanium layer and a titanium-tungsten layer, or a chromium layer and a copper layer. Therein, a hydrogen-fluorine solution (HF) and a aquaforits solution ($HNO_3$) are usually taken as etchants to patterning the copper layer; a sulfuric acid solution ($H_2SO_4$) and a dilute phosphoric solution comprising deionized water (DI water), phosphoric acid ($CH_3COOH$), acetic acid ($H_3PO4$) and hydrogen peroxide ($H_2O_2$), wherein the composition of said etchant can be refereed to U.S. Pat. No. 5,508,229, is taken as an etchant to define the nickel-vanadium layer. The hydrogen-fluorine solution or the mixed solution comprising ammonium hydroxide and hydrogen-fluorine (HF) as shown in U.S. Pat. Nos. 6,013,572 and 5,162,257 are usually taken as the etchants to define the titanium layer. Moreover, the mixed solution comprising hydrogen peroxide ($H_2O_2$), EDTA and potassium sulfate ($K_2SO_4$) as shown in U.S. Pat. No. 5,462,638 is taken as an etchant to pattern the adhesive layer made of titanium-tungsten. In addition, the mixed solution comprising hydro-chloric is taken as an etchant to pattern the adhesive layer made of chromium as shown in U.S. Pat. No. 5,162,257.

Besides, the under bump metallurgy layer applicable to bumping process for the aluminum wafer mainly comprises an aluminum layer, a nickel-vanadium layer and a copper layer. The etchant for patterning the aluminum layer comprises phosphoric acid, acetic acid and deionized water (DI). Therein, 83% of the etchant is phosphoric acid; 11% of the etchant is acetic acid; and 6% of the etchant is deionized water wherein the composition of the etchant can be referred to U.S. Pat. No. 5,508,229. However, not only the process shown in FIG. 1A but also the process specified in FIG. 1B, the step of patterning the first electrically layer is performed after the second electrically conductive layer are defined or patterned.

However, the steps of the mentioned-above bumping process usually at least cause the side of one portion of the patterned first electrically conductive layer disposed above the bonding pad to be undercut. Namely, there is at least one undercut formed at the side of one portion of the patterned first electrically conductive layer so as to make the cross-sectional area of the patterned first electrically conductive layer smaller and smaller. In such a manner, the mechanical strength of the redistributed layer will be reduced and the external force will cause the redistributed layer damaged more easily at the patterned first electrically conductive layer.

Therefore, providing another method for forming bumps to solve the mentioned-above disadvantages is the most important task in this invention.

SUMMARY OF THE INVENTION

In view of the above-mentioned problems, an objective of this invention is to provide a method of forming bumps to avoid an undercut at the side of the patterned first electrically conductive layer and to avoid reducing the mechanical strength of the redistributed layer so as to increase the reliability of the bumping process.

To achieve these and other advantages and in accordance with the purpose of the invention, as embodied and broadly described herein, the invention provides a method of forming a first dielectric layer on the active surface of the wafer wherein the first dielectric layer comprises a plurality of first openings and second openings to expose the bonding pads and the passivation layer formed on the active surface of the wafer respectively. Next, a patterned first electrically conductive layer is formed on the first dielectric layer, the exposed portions of the passivation layer through the second openings and the bonding pads exposed out of the first openings and then a patterned second electrically conductive layer is directly formed on the patterned first electrically conductive layer. Next, a second dielectric layer is formed above the first dielectric layer and the patterned second electrically conductive layer, and exposes portions of the patterned second electrically conductive layer disposed above the bonding pads to be regarded as the bump pads. Therein, the bump pads are electrically connected to the bonding pads through the patterned first electrically conductive layer and the patterned second electrically conductive layer. Finally, a plurality of bumps are formed on the bump pads and the step of reflowing the bumps is performed.

As mentioned above, after the first electrically conductive layer is patterned, the step of patterning the second electrically conductive layer is performed to avoid an undercut formed at the side of one portion of the patterned first electrically conductive layer of the redistributed layer. Namely, the side of the patterned first electrically conductive layer will be aligned with the patterned second electrically conductive layer. In other words, the projective area of said patterned first electrically conductive layer is larger than the projective layer of the patterned second electrically conductive layer. In such a manner, the mechanical strength of the redistributed layer will be increased.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
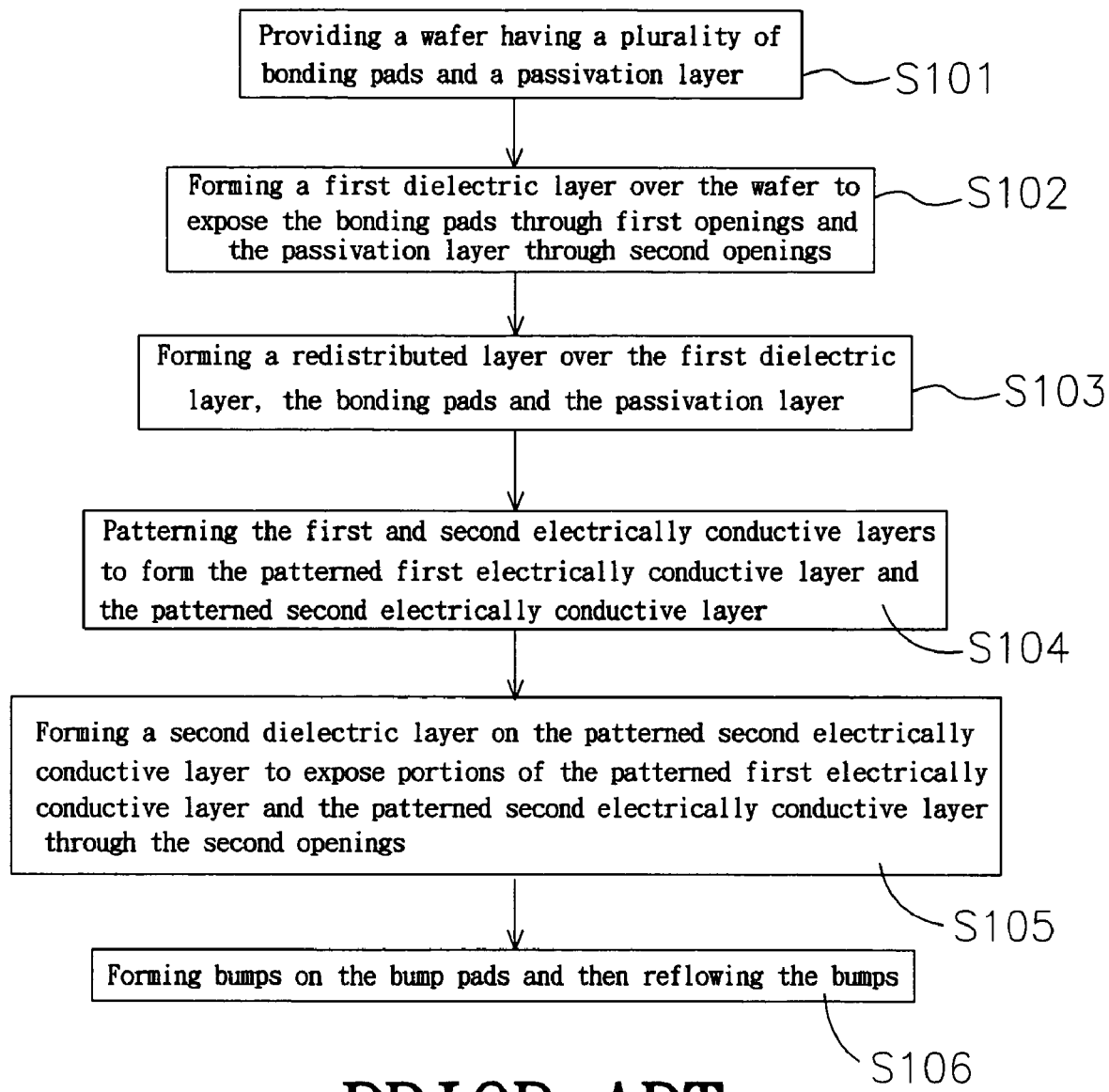
FIG. 1 illustrates a flow chart of the process flow of a conventional bumping process.

The method of forming bumps according to the preferred embodiment of this invention will be described herein below with reference to the accompanying drawings, wherein the same reference numbers are used in the drawings and the description to refer to the same or like parts.

FIGS. 2 to 11 are partially enlarged cross-sectional views showing the progression of steps for forming a bump according to the preferred embodiment of this invention.

Figure 2:
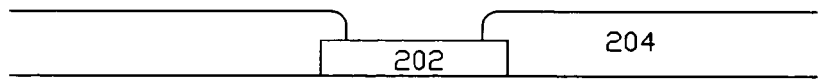
FIGS. 2 to 11 are partially enlarged cross-sectional views showing the progression of steps for forming a bump according to the preferred embodiment of this invention.

As shown in FIG. 2, a silicon wafer 200 having a plurality of bonding pads 202 and a passivation layer 204. Therein, the passivation layer 204 covers the active surface of the silicon wafer 200 and exposes the bonding pads 202.

Figure 3:
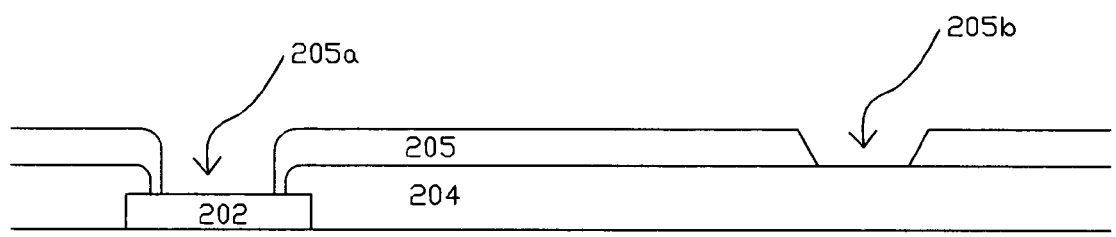
Figure 4:
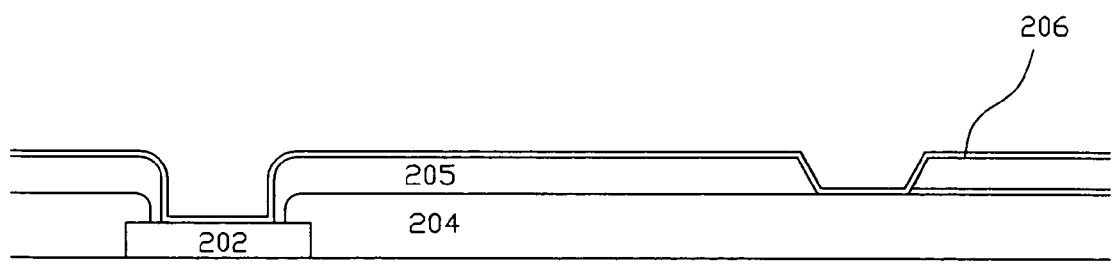

Next, referring to FIG. 3 and FIG. 4, a first dielectric layer 205 is formed above the passivation layer 204 to form a plurality of first openings 205a and second openings 205b wherein the first openings expose the bonding pads 202 and the second openings 205b expose portions of the passivation layer 204. Therein, the first dielectric layer 205 can be made of the material selected from one of polyimide, Benzocyclobutene (BCB) and polymer. Next, a first electrically conductive layer 206 is formed on the first dielectric layer 205 wherein the first electrically conductive layer 206 may comprise an adhesive layer contacting the bonding pads 202. For example, the adhesive layer comprises a titanium layer or a copper layer.

Figure 5:
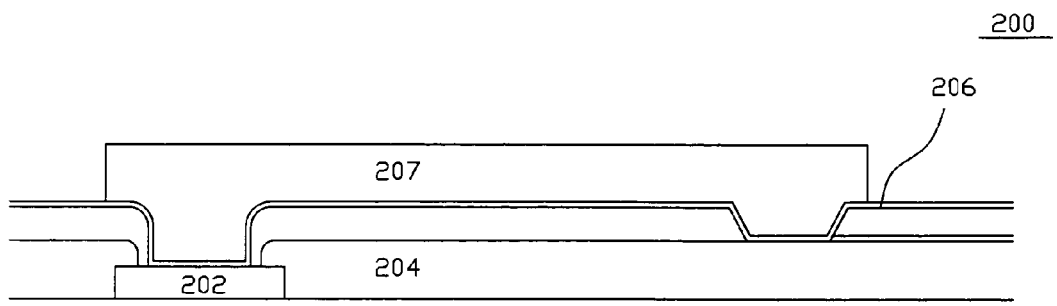
Figure 6:
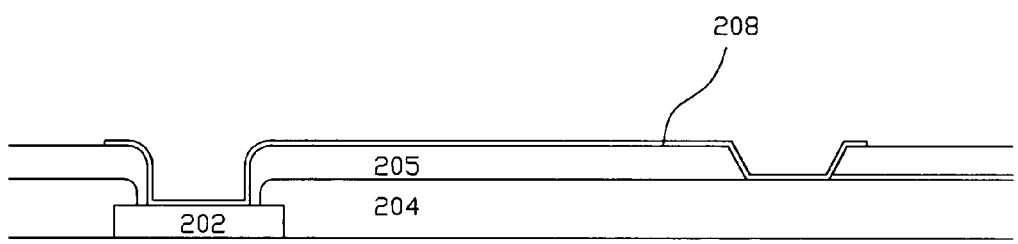

Next, referring to FIG. 5 and FIG. 6, a first photo-resist layer 207 is formed on the first electrically conductive layer 206 in order to pattern the first electrically conductive layer 206 by removing the portions of the first electrically conductive layer 206 not covered by the first photo-resist layer 207 so as to form a patterned first electrically conductive layer 208.

Figure 7:
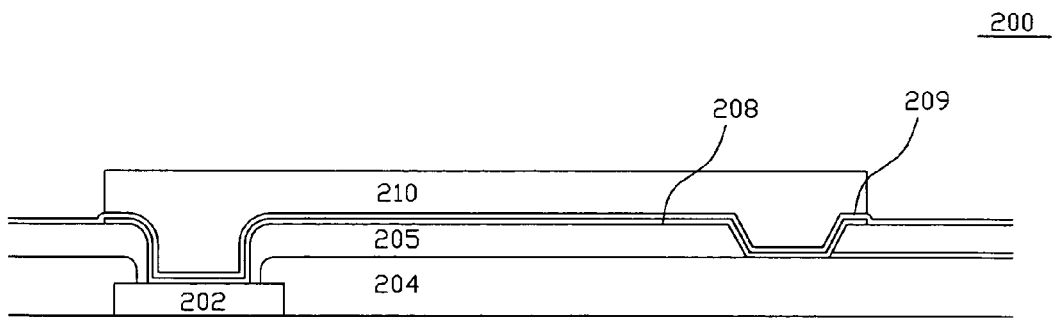

Afterwards, as shown in FIG. 7, a second electrically conductive layer 209 is formed on the patterned first electrically conductive layer 208 and portions of the first dielectric layer 205 and then portions of the second electrically conductive layer 209 is covered by a second photo-resist layer 210.

Figure 8:
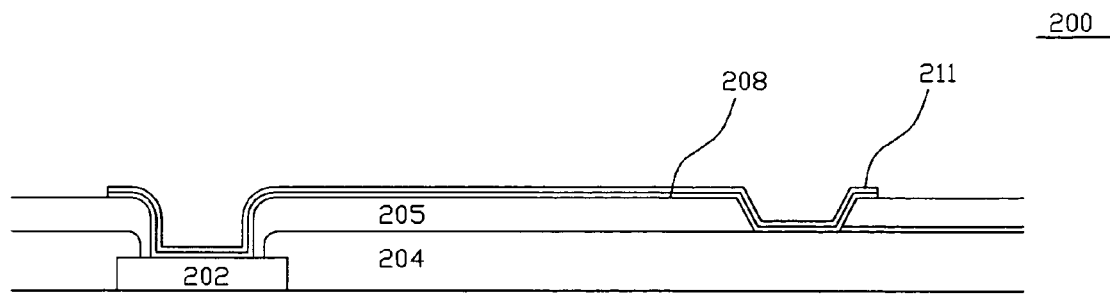

Next, referring to FIG. 8, portions of the second electrically conductive layer 209 not covered by the second photo-resist layer 210 are removed by an etching process. As mentioned above, the patterned first electrically conductive layer may comprise a titanium layer or an aluminum layer; and the patterned second electrically conductive layer 211 may comprises two layers made of a nickel-vanadium layer and a copper layer or may comprise three layers made of a titanium layer, a nickel-vanadium layer and a copper layer. Moreover, the patterned second electrically conductive layer 211 may be composed of a copper layer.

Figure 9:
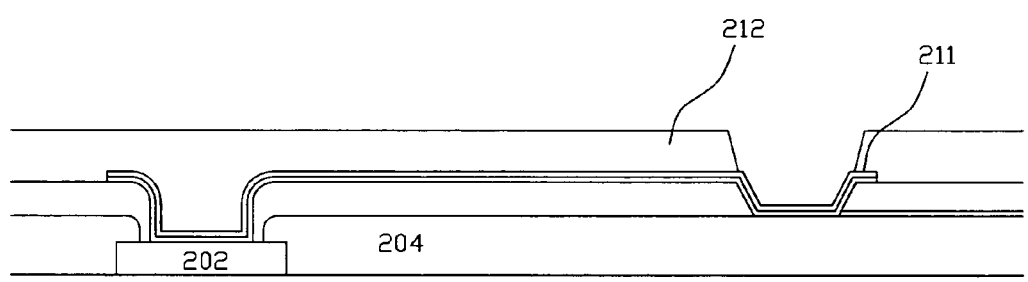

Then, referring to FIG. 9, a second dielectric layer 212 is formed above the first dielectric layer 205 and the patterned second electrically conductive layer 211, and exposes the portions of the patterned second electrically conductive layer 211 and the patterned first electrically conductive layer 208 disposed above the first openings so that the exposed portions of the patterned second electrically conductive layer are regarded as bump pads. Meanwhile, the redistributed layer is finished forming above the active surface of the wafer.

Figure 10:
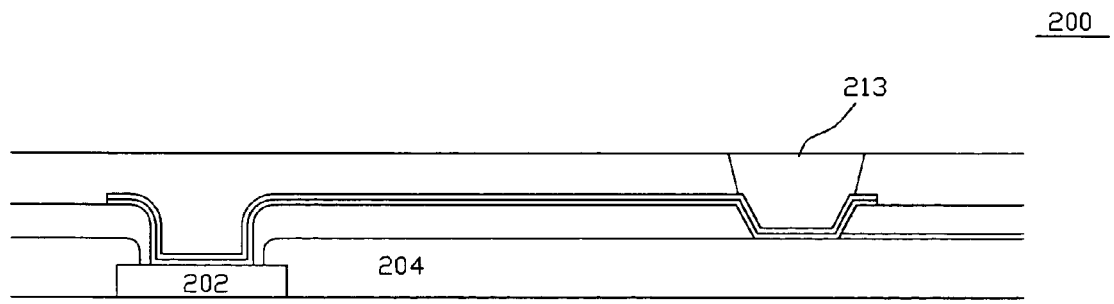

Afterwards, referring FIG. 10, a solder material is filled in the openings 205b so as to form a plurality of solder bumps 213. Therein, the solder material is formed by the method of plating and said solder material may be selected from one of lead-free and solder eutectic.

Figure 11:
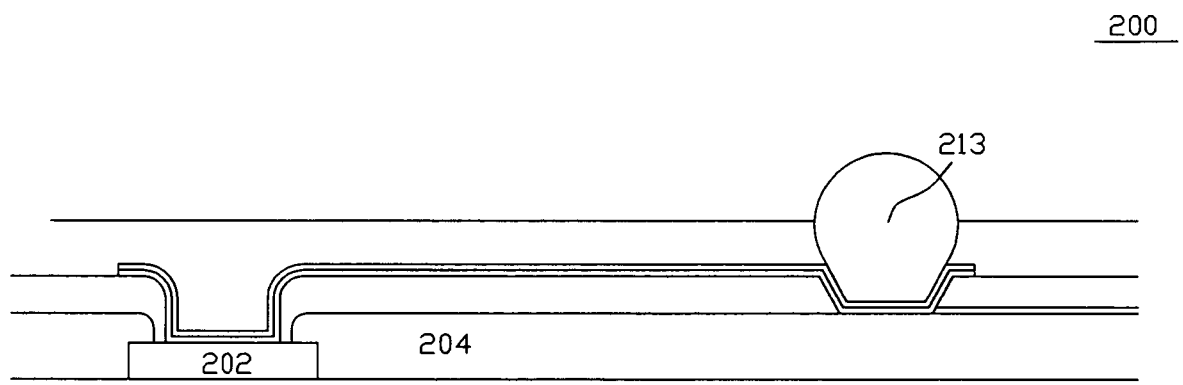

Finally, as shown in FIG. 11, a reflowed process is performed to shape the bumps 213 into a ball-like shape.

In this embodiment, after the first electrically conductive layer is patterned, the steps of disposing the second electrically conductive layer on the patterned first electrically conductive layer and patterning the second electrically conductive layer are performed to avoid an undercut formed at the side of one portion of the patterned first electrically conductive layer or the patterned second electrically conductive layer. Namely, the side of the patterned first electrically conductive layer will be aligned with the patterned second electrically conductive layer, and the projective area of the patterned first electrically conductive layers larger than the projective area of the patterned second electrically conductive layer. In such a manner, the mechanical strength of the redistributed layer will be increased.

Although the invention has been described in considerable detail with reference to certain preferred embodiments, it will be appreciated and understood that various changes and modifications may be made without departing from the spirit and scope of the invention as defined in the appended claims.

What is claimed is:

1. A method of forming a plurality of bumps on a wafer having an active surface, wherein the wafer further comprises a plurality of bonding pads formed on the active surface and a passivation layer formed on the active surface to expose the bonding pads, the method comprising the steps of:

forming a first dielectric layer above the active surface of the wafer, wherein the first dielectric layer has a plurality of first openings and second openings exposing the bonding pads and portions of the passivation layer respectively;

forming a first electrically conductive layer over the first dielectric layer, the bonding pads and the portions of passivation layer exposed out of the first dielectric layer through the second openings;

removing portions of the first electrically conductive layer covering the first dielectric layer to form a patterned first electrically conductive layer;

forming a second electrically conductive layer above the patterned first electrically conductive layer and the first dielectric layer, wherein the second electrically conductive layer is made of a material selected from one of nickel-vanadium, nickel, chromium-copper and nickel-titanium;

removing portions of the second electrically conductive layer which do not cover the patterned first electrically conductive layer to expose the first dielectric layer so as to form a patterned second electrically conductive layer; and forming a second dielectric layer above the first dielectric layer and the patterned second electrically conductive layer and exposing portions of the patterned second electrically conductive layer disposed above the second openings, wherein the portions of the patterned second electrically conductive layer exposed through the second openings are regarded as bump pads, and the bump pads are electrically connected to the bonding pads through the patterned first electrically conductive layer and the patterned second electrically conductive layer.

2. The method of claim 1, further comprising the step of forming a plurality of bumps on the bump pads.

3. The method of claim 2, wherein the bumps are formed by the method of plating.

4. The method of claim 2, wherein the bumps are formed by the method of screen-printing.

5. The method of claim 2, wherein the bumps are formed by the method of solder ball mounting.

6. The method of claim 1, wherein the step of removing the portions of the patterned second electrically conductive layer disposed above the bonding pads comprises forming a photo-resist layer on the second electrically conductive layer, patterning the photo-resist layer, and removing portions of the second electrically conductive layer according to the patterned photo-resist layer so as to expose the first dielectric layer.

7. The method of claim 1, further comprising the step of forming a patterned photo-resist layer above the second electrically conductive layer and removing portions of the second electrically conductive layer not covered by the patterned photo-resist layer so as to expose the first dielectric layer.

8. The method of claim 1, wherein the first dielectric layer is made of polyimide.

9. The method of claim 1, wherein the first dielectric layer is made of Benzocyclobutene.

10. The method of claim 1, wherein the first electrically conductive layer is made of a material selected from one of titanium, titanium-tungsten, aluminum and chromium.

11. The method of claim 2, further comprising the step of reflowing the bumps.

12. A method of forming a plurality of bumps on a wafer having an active surface, wherein the wafer further comprises a plurality of bonding pads formed on the active surface and a passivation layer formed on the active surface to expose the bonding pads, the method comprising the steps of:

forming a first electrically conductive layer over the bonding pads and the passivation layer;

removing portions of the first electrically conductive layer to form a patterned first electrically conductive layer so as to expose the passivation layer;

forming a second electrically conductive layer above the patterned first electrically conductive layer and the passivation layer, wherein the second electrically conductive layer comprises a nickel layer, a copper layer and a titanium layer in sequence;

removing portions of the second electrically conductive layer which do not cover the patterned first electrically conductive layer to expose the passivation layer so as to form a patterned second electrically conductive layer; and forming a dielectric layer above the patterned second electrically conductive layer and exposing portions of the patterned second electrically conductive layer to form exposed portions of the patterned second electrically conductive layer, wherein the exposed portions of the patterned second electrically conductive layer are regarded as bump pads and the bump pads are electrically connected to the bonding pads through the patterned first electrically conductive layer and the patterned second electrically conductive layer.

13. The method of claim 12, further comprising forming a plurality of bumps on the bump pads.

14. The method of claim 13, wherein the bumps are formed by the method of plating.

15. The method of claim 13, wherein the bumps are formed by the method of screen-printing.

16. The method of claim 13, wherein the bumps are formed by the method of solder ball mounting.

17. The method of claim 12, wherein the passivation layer is made of polyimide.

18. The method of claim 12, wherein the passivation layer is made of Benzocyclobutene.

19. A method of forming a plurality of bumps on a wafer having an active surface, wherein the wafer further comprises a plurality of bonding pads formed on the active surface and a passivation layer formed on the active surface to expose the bonding pads, the method comprising the steps of:

forming a first dielectric layer above the active surface of the wafer, wherein the first dielectric layer has a plurality of first openings and second openings exposing the bonding pads and portions of the passivation layer respectively;

forming a first electrically conductive layer over the first dielectric layer, the bonding pads and the portions of passivation layer exposed out of the first dielectric layer through the second openings;

removing portions of the first electrically conductive layer covering the first dielectric layer to form a patterned first electrically conductive layer;

forming a second electrically conductive layer above the patterned first electrically conductive layer and the first dielectric layer, wherein the second electrically conductive layer comprises a nickel layer, a copper layer and a titanium layer in sequence;

removing portions of the second electrically conductive layer which do not cover the patterned first electrically conductive layer to expose the first dielectric layer so as to form a patterned second electrically conductive layer; and forming a second dielectric layer above the first dielectric layer and the patterned second electrically conductive layer and exposing portions of the patterned second electrically conductive layer disposed above the second openings, wherein the portions of the patterned second electrically conductive layer exposed through the second openings are regarded as bump pads, and the bump pads are electrically connected to the bonding pads through the patterned first electrically conductive layer and the patterned second electrically conductive layer.

20. The method of claim 19, further comprising the step of forming a plurality of bumps on the bump pads.

* * * * *